United States Patent [19]

Hutchings et al.

[11] Patent Number: 5,378,655
[45] Date of Patent: Jan. 3, 1995

[54] METHOD OF MANUFACTURING A SEMICONDUCTOR DEVICE COMPRISING AN INSULATED GATE FIELD EFFECT DEVICE

[75] Inventors: Keith M. Hutchings, Groombridge; Kenneth R. Whight, Horsham, both of England

[73] Assignee: U.S. Philips Corporation, New York, N.Y.

[21] Appl. No.: 221,293

[22] Filed: Mar. 31, 1994

[30] Foreign Application Priority Data

Apr. 1, 1993 [GB] United Kingdom ............... 9306895

[51] Int. Cl.$^6$ ........................................ H01L 21/44
[52] U.S. Cl. .................................. 437/203; 437/41; 437/913; 257/330; 148/DIG. 126
[58] Field of Search ............... 437/41, 67, 203, 913, 437/44; 257/330-334; 148/DIG. 126

[56] References Cited

U.S. PATENT DOCUMENTS

| | | | |
|---|---|---|---|
| 4,767,722 | 8/1988 | Blanchard | 437/41 |
| 4,992,390 | 2/1991 | Chang | 437/42 |
| 5,086,007 | 2/1992 | Ueno | 437/41 |
| 5,270,257 | 12/1993 | Shin | 437/203 |
| 5,275,965 | 1/1994 | Manning | 437/67 |
| 5,298,780 | 3/1994 | Harada | 257/330 |

FOREIGN PATENT DOCUMENTS 1-310576  12/1989  Japan.

Primary Examiner—George Fourson
Assistant Examiner—David M. Mason
Attorney, Agent, or Firm—Paul R. Miller

[57] ABSTRACT

A mask (4) defining at least one window (4a) is provided on one major surface (1a) of a semiconductor body (1). The semiconductor body (1) is etched to define a groove (5) into a first region (2) of one conductivity type through a second region (3) of the opposite conductivity type. A relatively thin layer of gate insulator (6) is provided on the surface (5a) of the groove (5). A gate conductive region (7) of an oxidizable conductive material is provided within the groove (5) to define with the gate insulator layer an insulated gate structure (8) bounded by a conduction channel-defining area (30) of the second region (3). A step (15) in the surface structure is then defined by causing the insulated gate structure (8) to extend beyond the surrounding surface by oxidizing the exposed (7a) gate conductive material to define an insulating capping region (9) on the gate conductive region (3). A layer (10) is formed over the surface structure and etched anisotropically to leave portions (10a) of the layer on the side wall (8'a) of the step (15) defined by the insulated gate structure (8) and to define beneath the portions (10a) third regions (11) of the one conductivity type within the second region (3). An electrically conductive layer (12) is deposited to contact both the second and the third regions (3 and 11).

17 Claims, 5 Drawing Sheets

METHOD OF MANUFACTURING A SEMICONDUCTOR DEVICE COMPRISING AN INSULATED GATE FIELD EFFECT DEVICE

This invention relates to a method of manufacturing a semiconductor device comprising an insulated gate field effect device, in particular an insulated gate field effect device in which the insulated gate is formed within a groove or recess.

U.S. Pat. No. 4,967,245 describes a so-called trench power MOSFET which is an insulated gate field effect transistor formed of very many, typically hundreds of thousands, of parallel-connected insulated gate field effect device cells (generally referred to as source cells) sharing a common drain region. In the method described in U.S. Pat. No. 4,967,245 a semiconductor body is provided which has a first region of one conductivity type, n conductivity type in the case of an n channel device, which in the case of a power MOSFET will form the drain drift region. The first region is separated from a first major surface of the semiconductor body by a second region of the opposite conductivity type which is itself separated from the first major surface by a layer of the one conductivity type. A mask is provided on the first major surface to define at least one window through which the semiconductor body is then etched to define a groove extending through the second region into the first region so that the groove is bounded by surface areas of the second region. A relatively thin gate insulating layer is then provided on the surface of the groove and depend polycrystalline silicon is deposited and then etched back to expose the groove mask and define a gate conductive region within the groove.

The mask used to define the groove is formed of a material which resists oxidation, as described in U.S. Pat. No. 4,967,245 silicon nitride. After the etching back of the polycrystalline silicon to form the gate conductive region, the exposed surface areas of the polycrystalline silicon are oxidised to define a protective insulating capping region over the gate conductive region. As is well known in the semiconductor art such a local oxidation of silicon (LOCOS) technique results in so-called oxide bird's beaks at the edges of the anti-oxidation mask, that is areas where the oxidation proceeds slightly under the edges of the anti-oxidation mask. The capping region and adjoining bird's beaks regions are then used as a mask to etch through the first region to expose the second region leaving third regions of the one conductivity type beneath the bird's beak region. These third regions will form the source regions of a power MOSFET while the areas of the second region adjacent the insulated gate structure will define channel areas through which conduction occurs when an inversion channel is induced by the application of an appropriate voltage to the insulated gate. A conductive layer is then deposited to form the source electrode which contacts the edges of the source regions defined by the etching process and also shorts the surrounding areas of the second region to the source regions so as to avoid parasitic bipolar action.

Although such a method allows the source regions to be formed in a self-aligned manner and thus allows a reduction in cell size and hence an increase in cell density, the precise shape and size of the bird's beak regions depends on the degree to which oxidation occurs under the edges of the anti-oxidation mask which may depend upon, for example, the degree of adhesion of the anti-oxidation mask to the first major surface which in turn may depend upon the surface states and cleanliness of the first major surface. Thus, that slight variations in the LOGOS oxidation process may result in variations in the size and shape of the bird's beak regions which in turn may affect the size and shape of the source regions and thus the device characteristics. In addition, the necessary presence of the anti-oxidation mask on the first major surface during the formation, of the gate insulating layer may result in some contamination of the gate insulating layer which could affect the device performance characteristics.

It is an aim of the present invention to provide a method of manufacturing a semiconductor device comprising an insulated gate field effect semiconductor device which enables the third regions to be formed in a self-aligned manner and so allows for an increase in cell packing density where the device is a power semiconductor device consisting of many parallel-connected cells without having to rely on the use of so-called birds beak regions as a mask to define the third regions.

According to the present invention, there is provided a method of manufacturing a semiconductor device comprising an insulated gate field effect device, which method comprises providing a semiconductor body having first and second major surfaces with a first region of one conductivity type separated from the first major surface by a second region of the opposite conductivity type, providing on the one major surface a mask defining at least one window, etching the semiconductor body through the window to define a groove extending through the second region into the first region, providing a relatively thin layer of gate insulator on the surface of the groove, providing a gate conductive region of an oxidisable conductive material within the groove to define with the gate insulator layer an insulated gate structure bounded by a conduction channel-defining area of the second region, causing the insulated gate structure to extend beyond the surrounding semiconductor surface to define a step in the surface structure by oxidising the exposed conductive material to define an insulating capping region over the exposed surface of the gate conductive region and then providing a layer over the surface structure, etching the layer anisotropically to leave portions of the layer on the side wall of the step defined by the insulated gate structure and to define beneath the portions third regions of the one conductivity type within the second region, and depositing an electrically conductive layer to contact both the second and the third regions.

Thus, in a method according to the invention, after oxidation of the exposed surface of the gate conductive region, a portion of the insulated gate structure stands proud of the semiconductor surface, a layer is then deposited and anisotropically etched to leave portions or spacers on the exposed areas of the side walls of the insulated gate structure. The spacers are then used to define the third regions which are thus formed so as to be self-aligned to the insulated gate structure without the need for a local oxidation technique to define the third regions. This allows the size of the spacers and thus of the third regions to be determined simply by controlling the thickness of the layer provided over the surface structure. Moreover, there is no need for an anti-oxidation mask to be present on the first major surface when the gate insulating layer is being formed so that the possibilities for contamination of the gate insulating layer are reduced. In addition because the present invention does not rely on a local oxidation technique to define the third regions, the layer which is etched back to define the spacers need not necessarily be an oxide which should increase the flexibility of the method. This also means that the semiconductor body need not necessarily be made of a semiconductor, such as silicon, which is readily oxidisable.

The step of causing the insulated gate structure to extend beyond the surrounding semiconductor surface to define a step in the surface structure may further comprise etching back the first major surface using the capping region as a mask to leave areas of the side wall of the insulated gate structure exposed and projecting beyond the etched-back surface. This has the advantage that the step in the surface structure is not determined solely by the oxidation of the gate conductive region and can be adjusted as desired by etching away a selected thickness of the semiconductor body.

The layer may be an insulating layer. In one example, a layer of the one conductivity type is formed to separate the second regions from the first major surface and the anisotropic etching is continued so as to etch through the layer of the one conductivity type to define the third regions. The layer of the one conductivity type separating the second region from the first major surface may be formed either before or after oxidising the exposed conductive material. Forming the layer of one conductivity type after any etching back of the semiconductor surface may have advantages in that the thickness of the layer of one conductivity will not be affected by the etch-back step.

In another example, the layer may be provided as a layer doped with impurities of the one conductivity type and the third region may be formed by causing impurities to diffuse out of the portions of the layer left after the anisotropic etching into the second region. This allows the surface on either side of the insulated gate structure to be planar and should reduce any step coverage problems. Generally, the gate conductive region is formed of doped polycrystalline silicon.

An anti-oxidation layer may be provided on the first major surface before forming the gate conductive region. Thus, in one example, the gate insulator may be formed as an oxide layer covering the first major surface and the anti-oxidation layer formed by introducing nitrogen to cover at least a surface region of the gate oxide layer to a nitrogen oxide layer. This provides a relatively simply way of forming an anti-oxidation layer which is automatically aligned to the conductive gate region once that is formed. The use of an anti-oxidation layer facilities selective oxidation of the gate conductive region and avoids having to rely on the difference in the ratios and degrees to which the gate conductive material and the gate insulating material can be oxidised.

An electrically conductive layer may be provided on the second major surface so that in operation of the device the main current path is between the first and second major surfaces through the first region, that is so that the insulated gate field effect device is a vertical device. The present invention could however also be applied to lateral devices and to top drain or anode contact vertical devices.

The insulated gate field effect device may be an insulated gate field effect transistor or any other MOS-controlled device such as a MOS-gated thyristor. At least one fourth region of the opposite conductivity type may be provided spaced from the second region by the first region for injecting charge carriers of the opposite conductivity type into the first region during operation of the device so that the insulated gate field effect device forms an insulated gate bipolar transistor.

The window in the mask may be defined so that the groove forms a grid-like trench. This has particular advantages in the case of vertical power insulated gate field effect devices.

BRIEF DESCRIPTION OF THE DRAWINGS

Embodiments of the invention will now be described, by way of example, with reference to the accompanying drawings, in which.

It should of course be understood that the drawings are schematic and are not to scale. Thus, for example, the thickness of various layers or regions may have been relatively exaggerated in the interests of clarity. Like reference numerals are used throughout to refer to like parts.

Figure 1:
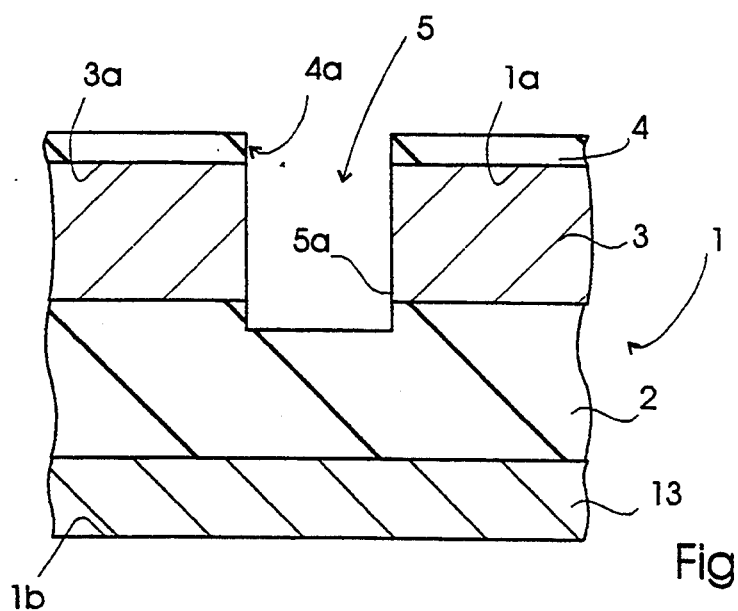
FIGS. 1 to 8 show schematic cross-sectional views of part of a semiconductor body for illustrating one example of a method in accordance with the invention.

Referring now to the drawings, there are illustrated methods of manufacturing a semiconductor device comprising an insulated gate field effect device, which methods comprise providing a semiconductor body 1 having first and second major surfaces 1a and 1b with a first region 2 of one conductivity type separated from the first major surface 1a by a second region 3 of the opposite conductivity type, providing on the one major surface 1a mask 4 defining at least one window 4a, etching the semiconductor body 1 through the window 4a to define a groove 5 extending through the second region 3 into the first region 2, providing a relatively thin layer of gate insulator 6 on the surface 5a of the groove 5 providing a gate conductive region 7 of an oxidisable conductive material within the groove 5 to define with the gate insulator layer an insulated gate structure 8 bounded by a conduction channel-defining area 30 of the second region 3, causing the insulated gate structure 8 to extend beyond the surrounding semiconductor surface to define a step 15 in the surface structure by oxidising the exposed 7a gate conductive material to define an insulating capping region 9 over the exposed surface 7a of the gate conductive region 3 and then providing a layer 10 over the surface structure, etching the layer 10 anisotropically to leave portions 10a of the layer on the side wall 8a of the step defined by the insulated gate structure 8 and to define beneath the portions 10a third regions 11 of the one conductivity type within the second region 3 and depositing an electrically conductive layer 12 to contact both the second and the third regions 3 and 11.

Thus, in a method according to the invention, after oxidation of the exposed surface 7a of the gate conductive region 7, a portion of the insulated gate structure 8 stands proud of the semiconductor surface 3b, a layer 10 is then deposited and anisotropically etched to leave portions or spacers 10a on the exposed areas 8a' of the side walls 8 of the insulated gate structure 8. The spacers 10a are then used to define the third regions 11 which are thus formed so as to be self-aligned to the insulated gate structure 8 without relying on using a mask defined by a local oxidation technique. This allows the size of the spacers 10a and thus of the third regions 11 to be determined simply by controlling the thickness of the layer 10. In addition, the layer 10 which is etched back to define the spacers 10a need not necessarily be an oxide which should increase the flexibility of the method and, of course, means that the semiconductor body 1 need not necessarily to made of a semiconductor, such as silicon, which is readily oxidisable.

An insulated gate field effect device in accordance with the invention may be, for example, a power MOSFET which consists of many hundreds of parallel-connected insulated gate field effect transistors having a common drain region or any other MOS-controlled device such as an insulated gate bipolar transistor (IGBT).

FIGS. 1 to 8 are cross-sectional views through part of a semiconductor body 1 for illustrating a first example of a method in accordance with the invention. It will of course be appreciated that, in the case of a power device, the structure being formed within the semiconductor body 1 will consist of many hundreds of parallel identical structures but that, in the interests of simplicity, only one of these structures is shown.

The semiconductor body 1 consists in this example of a relatively highly doped single crystal silicon substrate 13 onto which the first region 2 is formed as an epitaxial layer that is relatively lowly doped with impurities of one conductivity type. Where the semiconductor device is to be a power MOSFET then the substrate 13 and first region or epitaxial layer 2 will be of the same conductivity type, n conductivity type for an n-channel MOSFET, whereas where the semiconductor device is to be, for example, an IGBT tile substrate 13 will be of the opposite conductivity type, p conductivity type in the case of an n-channel IGBT. The present invention could of course also be applied to so-called anode-shorted IGBTs as described in, for example, U.S. Pat. No. 4,969,028 in which the opposite conductivity type injector regions are formed not by an oppositely doped substrate but by spaced doped injector regions extending into the relatively highly doped substrate of the one conductivity type from the second major surface 1b.

The second region 3 that will define the conduction channel regions of the insulated gate field effect device may be formed either as a second epitaxial layer of the opposite conductivity type deposited onto the epitaxial layer 2 or may be formed by introducing impurities of the opposite conductivity type into the epitaxial layer 2.

As shown in FIG. 1, a mask 4 is provided on the first major surface 1a. The mask 4 may be formed of any suitable material, for example, a photosensitive resist, and a window 4a is opened in the mask using conventional photolithographic and etching techniques to expose an area of the first major surface 1a.

The exposed semiconductor material is then anisotropically etched to define a groove 5 extending through the third region 3 into the second region 2.

Figure 2:
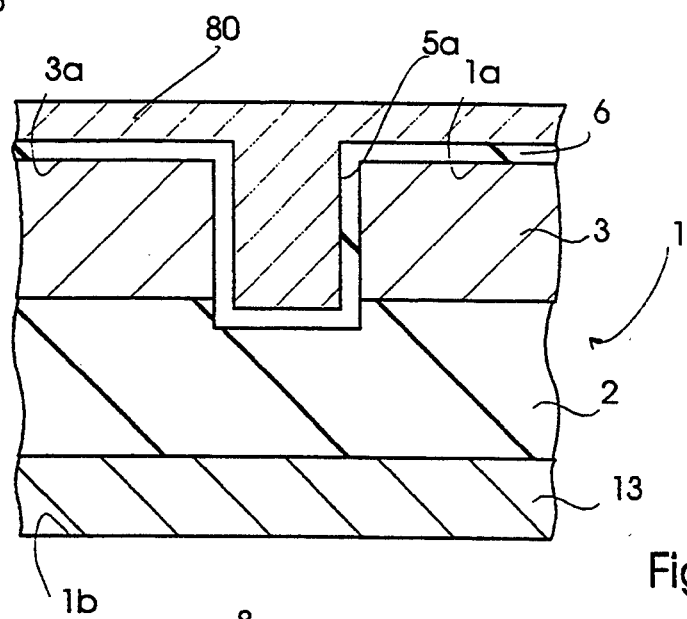

After removal of the mask 4 and usual surface cleaning, as shown in FIG. 2, a relatively thin layer of gate insulating material 6 is provided on the first major surface 1a and the surface 5a of the groove 5. The gate insulating layer 6 is normally formed by a conventional thermal oxidation process carried out in a special furnace so as to avoid contamination of the gate insulating. This should result in a high purity date oxide.

Figure 3:
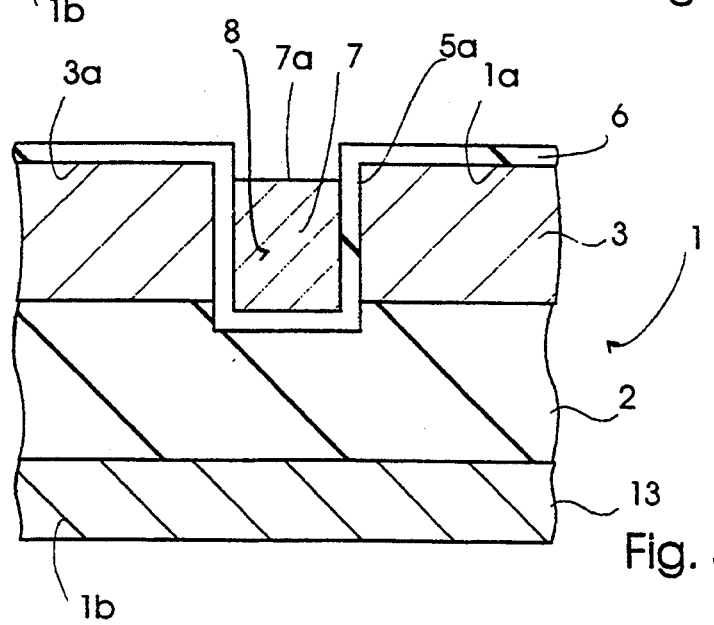

A layer 80 of oxidisable conductive material, in this example heavily doped, generally phosphorus-doped, polycrystalline silicon, is then provided over the one major surface using conventional deposition techniques and is etched back until the surface of the gate insulating layer 6 is exposed thereby leaving a gate conductive region 7 within tile groove 5. As shown in FIG. 3, the doped polycrystalline silicon may be etched back to be level with or slightly below the first major surface 1a.

The gate conductive region 7 and gate insulating layer 6 together define an insulated gate structure 8.

Figure 4:
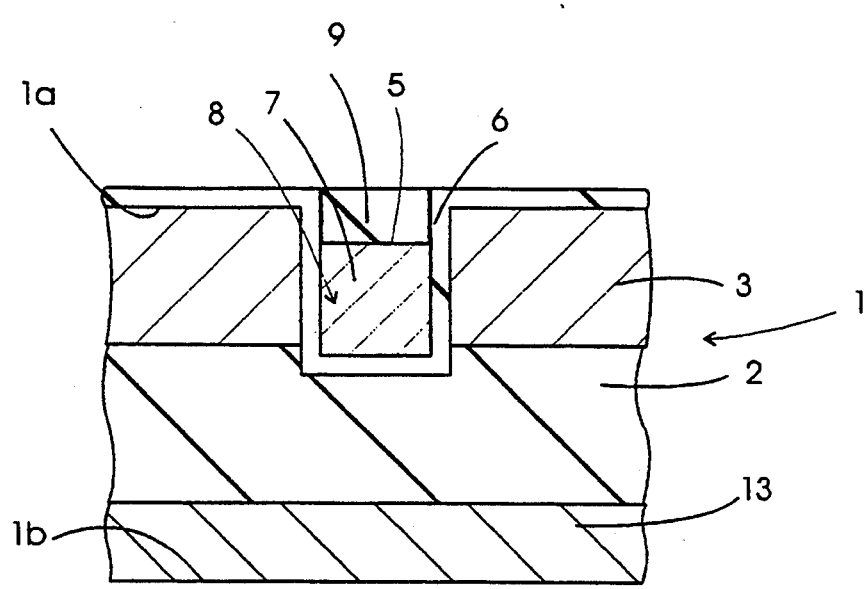

The exposed surface 7a of the gate conductive region 7 is then oxidised using one of the methods to be described below to form, as illustrated in FIG. 4, a protective capping oxide region 9 which is thicker than the gate insulating layer 6.

Figure 5:
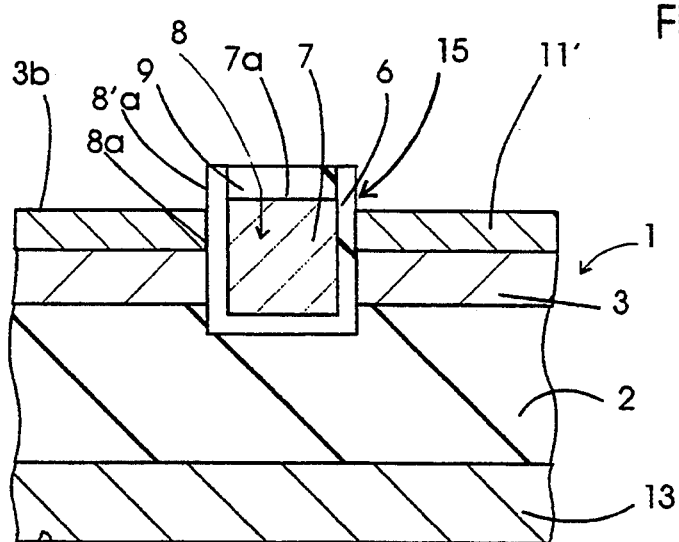

The insulating material is then etched back using a conventional etchant so that the exposed region of the gate insulating layer but only a slight thickness of the capping oxide region 9 are removed as shown in FIG. 5.

Although the oxidation of the gate conductive region 7 may form a capping region 9 of sufficient thickness to provide a suitable step 15 in the surface structure, the size of this step 15 may be increased by using an appropriate etchant which etches the semiconductor body 1 selectively with respect to the protective capping oxide region 9 to etch back the surface areas 3a of the second region 3 to define a new etched back surface 3b as shown in FIG. 5. In this example, the insulated gate structure 8 extends beyond and thus stands proud of the etched back surface 3b so that areas 8a' of the side walls 8 of the insulated gate structure are exposed and define with the etched back surface areas 3b the step 15 in the surface structure.

In this example impurities of the one conductivity type are then introduced, generally implanted and diffused to define areas 11' of the one conductivity type bounding the capped insulated gate structure.

Figure 6:
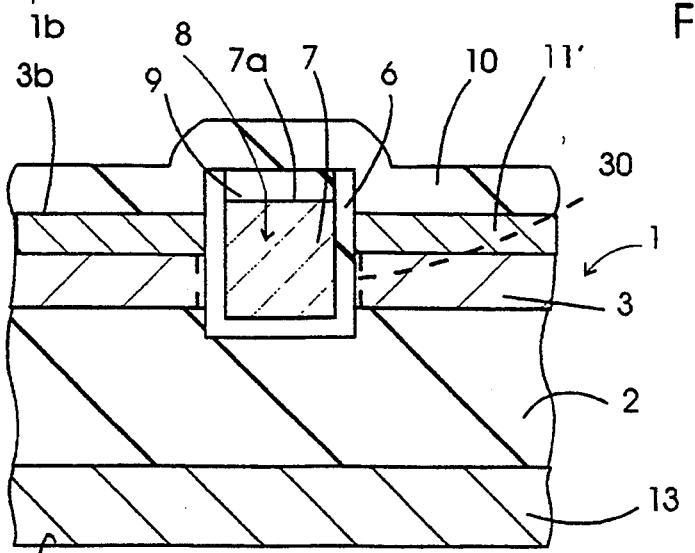

A layer 10 of, in this example, insulating material such as a silicon oxide (or other insulating material which can be selectively etched with respect to the semiconductor surface) is then deposited over the surface to produce the structure shown in FIG. 6.

Figure 7:
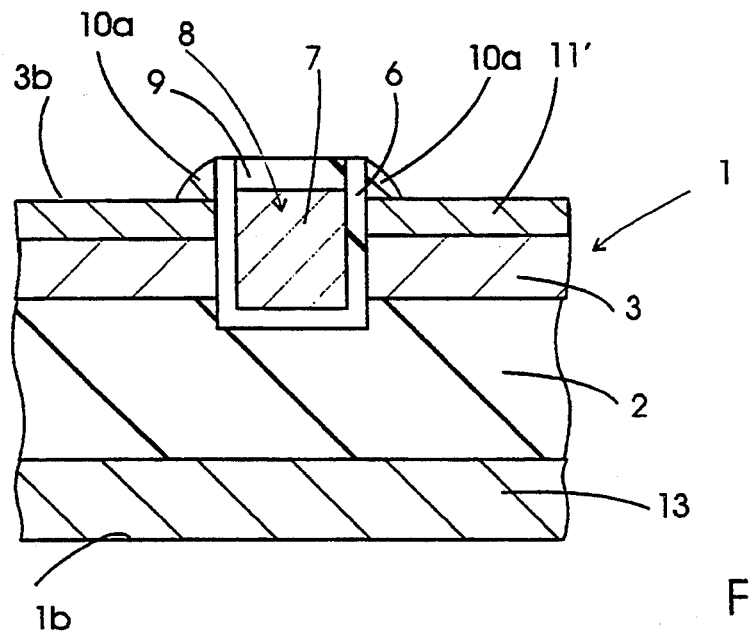
Figure 8:
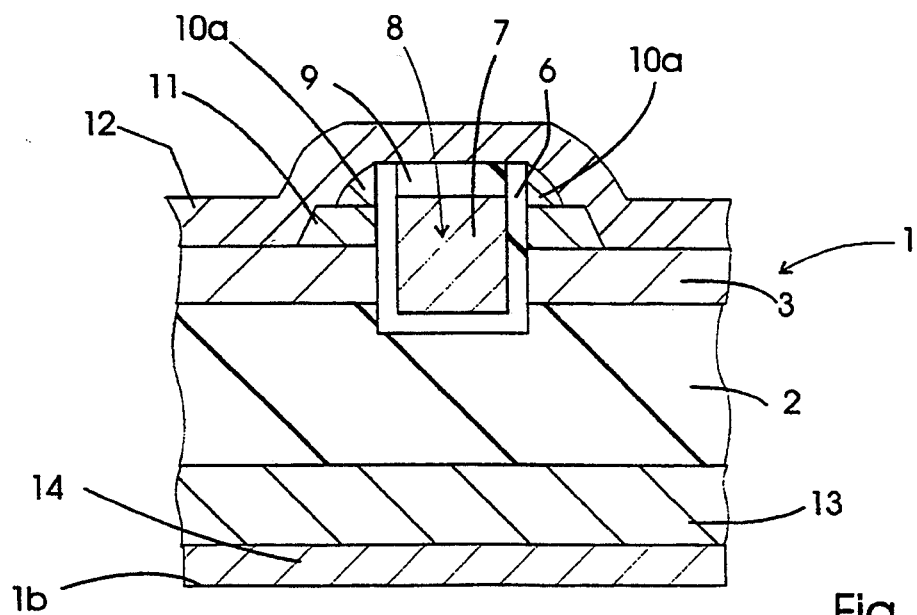

The insulating layer 10 is then etched anisotropically until the surface areas 3b are exposed. By virtue of the step 15 formed in the surface structure by the capped insulated gate structure 8, this leaves portions or spacers 10a of the insulating material on the exposed areas 8'a of the side walls 8a of the insulated gate structure 8 as shown in FIG. 7. The width, that is the lateral extent of the spacers 10a on the surface areas 3b, is determined by the initial thickness of the layer 10 which, as will be appreciated by those skilled in the art, can be controlled relatively easily.

The spacers 10a; and the capping region 9 are then used as a mask to enable the areas 11' to be etched anisotropically until the underlying second region 3 is exposed so as to define the third regions 11 beneath the insulating spacers 10a. A layer of metallisation, generally aluminium, is then deposited and patterned to define a first electrode 12 contacting the third regions 11 and shorting the third regions 11 to the second regions to inhibit potential parasitic bipolar action and a second gate electrode (not shown) contacting the insulated gate structure through an appropriate contact window (not shown). Another layer 16 of metallisation is provided on the second major surface to form a third electrode contacting the substrate 13.

Where the semiconductor device is an insulated gate field effect transistor then the third regions 11 form source regions of the transistor and the second region 3 defines adjacent the insulated gate structure a conduction channel area 30 within which a conduction channel can be defined by the application of an appropriate voltage to the insulated gate structure 8 to enable conduction between the source region 11 and the second region 3 which forms the drain drift region of the transistor 1a this case the third electrode forms the drain electrode. The situation is similar for an IGBT except that the source 12 and drain electrodes 14 are normally known as the cathode and anode electrodes.

Figure 9:
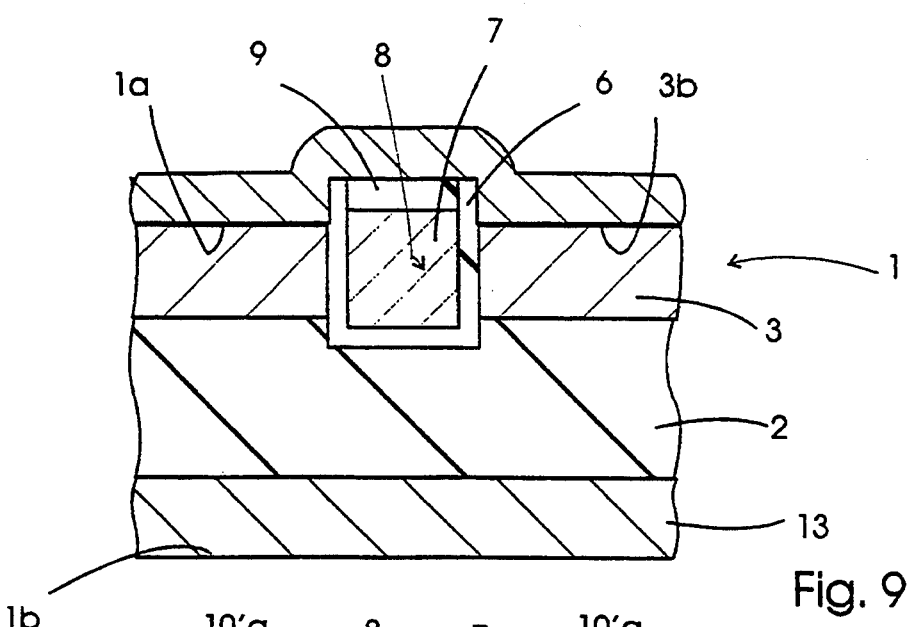
FIGS. 9 to 11 show schematic cross-sectional views of part of a semiconductor body for illustrating a second example of a method in accordance with the invention.
Figure 10:
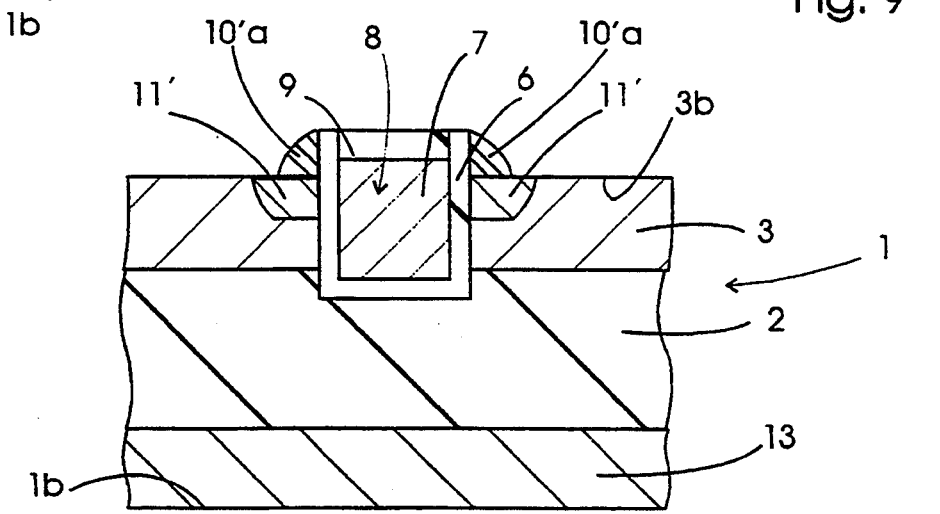
Figure 11:
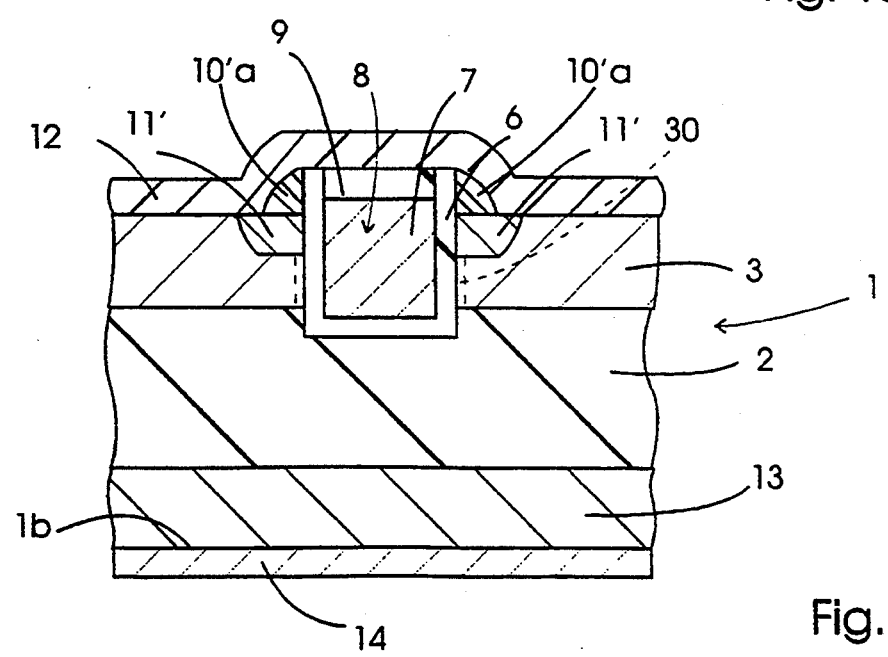

FIGS. 9 to 11 illustrate another example of a method in accordance with the invention. This method proceeds in a manner similar to that described above with reference to FIGS. 1 to 5. However, in this example, as shown in FIG. 9, a layer 10' of doped material, for example doped polycrystalline silicon or a doped oxide or glass, is provided using a low temperature deposition technique on the etched back semiconductor surface 3b.

The doped layer 10' is anisotropically etched to define the doped spacers 10'a as shown in FIG. 10 and the structure is then heated to, for example, about 1000° C. (degrees Celsius) to cause impurities to diffuse out of the doped spacers 10'a into the underlying portion of the second region 3 to define the third regions 11. If necessary, a short dip etch may then be carried out to remove any slight amount of impurities which may have diffused out of the doped layer 10' into the semiconductor surface 3a before definition of the spacers 10'a.

As can be seen from FIG. 10, the lateral diffusion of the impurities causes the third regions 11 to extend beyond the spacers 10'a so that when the metallisation is deposited as described above to define the first and gate (not shown) electrodes, the first electrode 12 contacts the third regions 11. This method has the advantage of providing a flatter, in comparison to the first-described method, surface onto which to deposit the metallisation.

As will be appreciated from the above description, the present invention requires that the protective capping oxide region 9 formed over the gate conductive region 7 be thicker than the gate insulator so that the gate conductive region 7 remains encapsulated when the exposed areas of the gate insulator are removed. This could be achieved simply by relying on the fact that very heavily doped, particularly phosphorus-doped, polycrystalline silicon oxidises much more rapidly than thermal or gate oxide but such a method may be very sensitive to actual process conditions and may not be particularly reproduceable. Alternatively, the gate insulating layer may be covered by a layer which is resistant to oxidation. Thus, for example, the normal gate oxide could be covered by a layer of silicon nitride. As another example the gate insulating layer 6 could be formed of a material, other than silicon oxide, which is resistant to oxidation.

Figure 12:
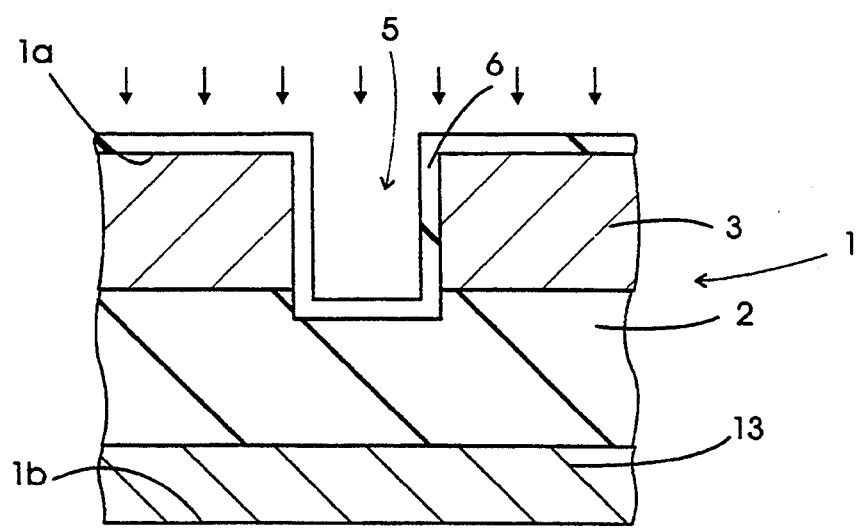
FIGS. 12 and 13 show schematic cross-sectional views of part of a semiconductor body for illustrating further detail of part of an example of a method in accordance with the invention.
Figure 13:
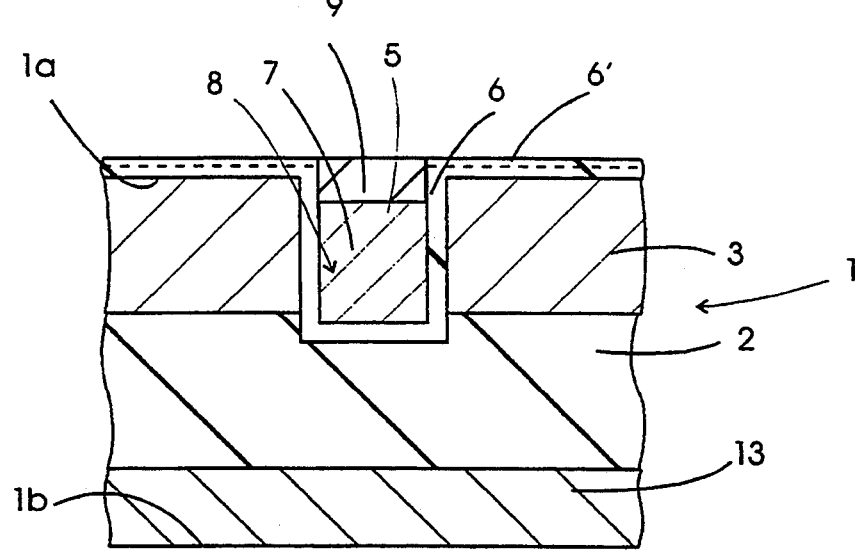

FIGS. 12 and 13 illustrate one other way of enhancing the oxidation rate of the doped polycrystalline silicon relative to the gate insulating layer 6 where the gate insulating layer is a thermally grown silicon oxide layer.

Thus, as illustrated in FIG. 12, after removal of the mask 4, the exposed silicon surface is oxidised using conventional techniques to define a thermal gate oxide layer 6. The gate oxide layer 6 is then subjected to a nitridation treatment by for example implantation of nitrogen into the gate oxide layer 6 or by heating the semiconductor body in ammonia (both of which techniques are described in a paper entitled selective oxidation technologies for high density MOS by J. Hui, T. Y. Chiu, S. Wong and W. G. Oldham published in IEEE Electron Device letters Volume EOL.2, No. 10, October 1981 at pages 244 to 247).

This nitridation treatment results in an oxynitride layer 6' (shown schematically in FIG. 13 by way of a dashed line) at the top of the gate oxide layer 6. The oxynitride layer is resistant to oxidation so that during the subsequent oxidation of the exposed gate conductive region, the gate oxide layer is not significantly oxidised so resulting in the structure shown in FIG. 13.

The remainder of the process may continue as described above with reference to FIGS. 1 to 8 or as modified by FIGS. 9 to 11.

As indicated above, the semiconductor device may be a power semiconductor device consisting of many hundreds of parallel-connected source cells with a common drain drift region.

Figure 14:
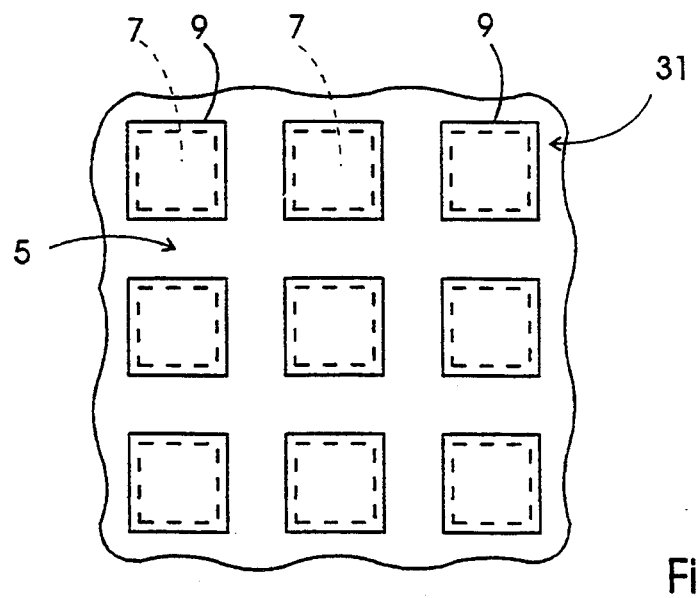
FIG. 14 is a plan view of part of an insulated gate field effect device formed using a method in accordance with the invention but from which the top metallisation has been omitted in the interests of clarity.

FIG. 14 is a top plan view of part of a semiconductor device manufactured using a method in accordance with the invention with the metallisation forming the source and gate electrodes omitted in order to show the structure.

As can be seen from FIG. 14, the groove 5 is formed as a regular grid-like trench so as to divide the second region 3 into a number of regularly shaped, as shown square, second cell regions 31 each of which is associated with an annular third region 11 bounded by the grid-like trench or groove 5. Of course, any suitable layout for the geometry of the semiconductor device may be adopted.

The power semiconductor device may be integrated in the same semiconductor body as various logic components, for example low and/or high voltage lateral transistors, so as to form a power integrated circuit, an intelligent power switch or a smart power device, depending upon the degree and complexity of the integrated logic.

The present invention may of course be applied to discrete power semiconductor devices and to lateral as well as vertical current flow devices. Furthermore, the present invention may be applied to semiconductor devices, other than power semiconductor devices, which consist of only one or a few insulated gate field effect device cells.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device comprising an insulated gate field effect device, which method comprises providing a semiconductor body having first and second major surfaces with a first region of one conductivity type separated from the first major surface by a second region of the opposite conductivity type, providing on the one major surface a mask defining at least one window, etching the semiconductor body through the window to define a groove extending through the second region into the first region, providing a layer of gate insulator on the surface of the groove, providing a gate conductive region of an oxidizable conductive material within the groove to define with the gate insulator layer an insulated gate structure bounded by a conduction channel-defining area of the second region, causing the insulated gate structure to extend beyond the surrounding semiconductor surface to define at least one step in the surface structure by oxidizing the exposed conductive material to define an insulating capping region over the exposed surface of the gate conductive region and then providing a layer over the surface structure, etching the layer anisotropically to leave portions of the layer on the sidewall of the steps defined by the insulated gate structure and to define beneath the portions third regions of the one conductivity type within the second region, and depositing an electrically conductive layer to contact both the second and the third regions.

2. A method according to claim 1, wherein the step of causing the insulated gate structure to extend beyond the surrounding semiconductor surface to define a step in the surface structure further comprises etching back the first major surface using the capping region as a mask to leave areas of the side walls of the insulated gate structure exposed and projecting beyond the etched-back surface.

3. A method according to claim 2, which comprises providing the layer as an insulating layer.

4. A method according to claim 3, which comprises forming a layer of the one conductivity type to separate the second region from the first major surface and continuing the anisotropic etching so as to etch through the layer of the one conductivity type to define the third regions.

5. A method according to claim 4, which comprises forming the layer of the one conductivity type to separate the second region from the first major surface after oxidizing the exposed conductive material.

6. A method according to claim 2, which comprises providing the layer as a layer doped with impurities of the one conductivity type and forming the third region by causing impurities to diffuse out of the portions of the layer left after the anisotropic etching into the second region.

7. A method according to claims 1, which comprises forming the gate conductive region of doped polycrystalline silicon.

8. A method according to claim 7, which comprises providing an anti-oxidation layer on the first major surface before forming the gate conductive region.

9. A method according to claim 8, which comprises forming the gate insulator as an oxide layer covering the first major surface and forming the anti-oxidation layer by introducing nitrogen to convert at least a surface region of the gate oxide layer to a nitrogen oxide layer.

10. A method according to claim 1, which comprises providing an electrically conductive layer on the second major surface so that in operation of the device the main current path is between the first and second major surfaces through the first region.

11. A method according to claim 1, which comprises providing at least one fourth region of the opposite conductivity type spaced from the second region by the first region for injecting charge carriers of the opposite conductivity type into the first region during operation of the device.

12. A method according to claim 1, which comprises defining the window in the mask so that the groove forms a grid-like trench.

13. A method according to claim 2, which comprises forming a layer of the one conductivity type to separate the second region from the first major surface and continuing the anisotropic etching so as to etch through the layer of the one conductivity type to define the third regions.

14. A method according to claim 1, which comprises providing the layer as an insulating layer.

15. A method according to claim 1, which comprises forming a layer of the one conductivity type to separate the second region from the first major surface and continuing the anisotropic etching so as to etch through the layer of the one conductivity type to define the third regions.

16. A method according to claim 15, which comprises forming the layer of the one conductivity type to separate the second region from the first major surface after oxidizing the exposed conductive material.

17. A method according to claim 1, which comprises providing the layer as a layer doped with impurities of the one conductivity type and forming the third region by causing impurities to diffuse out of the portions of the layer left after the anisotropic etching into the second region.

* * * * *